(12) United States Patent
Miller et al.

(10) Patent No.: US 9,716,379 B2
(45) Date of Patent: Jul. 25, 2017

(54) WIDE RANGE CURRENT MONITORING SYSTEM AND METHOD FOR ELECTRONIC TRIP UNITS

(71) Applicant: EATON CORPORATION, Cleveland, OH (US)

(72) Inventors: Theodore James Miller, Oakdale, PA (US); Daniel A. Hosko, Pittsburgh, PA (US); George Gao, Warrendale, PA (US)

(73) Assignee: EATON CORPORATION, Cleveland, OH (US)

( * ) Notice: Subject to any disclaimer, the term of this patent is extended or adjusted under 35 U.S.C. 154(b) by 127 days.

(21) Appl. No.: 14/840,272

(22) Filed: Aug. 31, 2015

(65) Prior Publication Data

US 2017/0063070 A1    Mar. 2, 2017

(51) Int. Cl.

| | |
|---|---|
| H02H 3/00 | (2006.01) |
| H02H 3/08 | (2006.01) |
| G01R 15/00 | (2006.01) |
| H01H 83/00 | (2006.01) |
| H02H 3/44 | (2006.01) |
| H02H 1/00 | (2006.01) |

(52) U.S. Cl.
CPC ............... *H02H 3/08* (2013.01); *G01R 15/00* (2013.01); *H01H 83/00* (2013.01); *H02H 3/44* (2013.01); *H02H 1/0046* (2013.01)

(58) Field of Classification Search
USPC .................................................... 361/42–50
See application file for complete search history.

(56) References Cited

U.S. PATENT DOCUMENTS

| | | |
|---|---|---|
| 5,341,191 A | 8/1994 | Crookston et al. |
| 5,910,760 A | 6/1999 | Malingowski et al. |
| 6,144,271 A | 11/2000 | Mueller et al. |
| 6,567,250 B1 | 5/2003 | Haun et al. |

(Continued)

FOREIGN PATENT DOCUMENTS

DE       26 53 574 A1    6/1978

OTHER PUBLICATIONS

European Patent Office, "International Search Report and Written Opinion", PCT/US2016/048820, Dec. 7, 2016, 12 pp.

*Primary Examiner* — Danny Nguyen
(74) *Attorney, Agent, or Firm* — Eckert Seamans; Philip E. Levy; Grant E. Coffield

(57) ABSTRACT

A circuit interrupter that includes a passive integration channel structured to receive an output signal from a di/dt current sensor and generate a first signal output based on the output signal, and an active integration channel structured to receive the output signal from the di/dt current sensor and generate a second signal output based on the output signal that is proportional to the primary current received by the di/dt current sensor. Circuit protection functionality is provided based on the first signal output responsive to the primary current being determined to be greater than a threshold level, current metering and circuit protection functionality is provided based on the second signal output responsive to the primary current being determined to be less than or equal to the threshold level, and a seed current value is provided to the active integrator based on the first signal output.

13 Claims, 3 Drawing Sheets

(56) References Cited

U.S. PATENT DOCUMENTS

| | | | |
|---|---|---|---|
| 6,839,208 B2* | 1/2005 | Macbeth | H02H 1/0015 324/520 |
| 6,850,135 B1 | 2/2005 | Puskar et al. | |
| 6,972,937 B1* | 12/2005 | Macbeth | H02H 1/0015 361/42 |
| 2001/0033469 A1 | 10/2001 | Macbeth et al. | |
| 2004/0066593 A1 | 4/2004 | Kolker et al. | |
| 2008/0055795 A1 | 3/2008 | Miller | |

* cited by examiner

WIDE RANGE CURRENT MONITORING SYSTEM AND METHOD FOR ELECTRONIC TRIP UNITS

BACKGROUND

Field

The disclosed concept pertains generally to circuit interrupters and, more particularly, to a system and method for wide range monitoring of current in a configurable circuit interrupter employing an electronic trip units.

Background Information

Electrical switching apparatus such as circuit interrupters and, in particular, circuit breakers (e.g., of the molded case variety), are well known in the art. See, for example, U.S. Pat. No. 5,341,191.

Circuit breakers are used to protect electrical circuitry from damage due to an overcurrent condition, such as an overload condition or a relatively high level short circuit or fault condition. Molded case circuit breakers typically include a pair of separable contacts per phase. The separable contacts may be operated either manually by way of a handle disposed on the outside of the case or automatically in response to an overcurrent condition. Typically, such circuit breakers include: (i) an operating mechanism which is designed to rapidly open and close the separable contacts, and (ii) a trip unit which senses overcurrent conditions in an automatic mode of operation. Upon sensing an overcurrent condition, the trip unit sets the operating mechanism to a trip state, which moves the separable contacts to their open position.

Industrial molded case circuit breakers often use a circuit breaker frame which houses a trip unit. See, for example, U.S. Pat. Nos. 5,910,760; and 6,144,271. The trip unit may be modular and may be replaced in order to alter the electrical properties of the circuit breaker.

It is well known to employ trip units which utilize a microprocessor to detect various types of overcurrent trip conditions and to provide various protection functions, such as, for example, a long delay trip, a short delay trip, an instantaneous trip, and/or a ground fault trip.

Circuit breakers must operate and provide both circuit protection and metering functionality over a wide range of currents. The full range of the currents for protection and metering can cover a range of 100,000:1. As an example, a circuit breaker measures currents from 1 ampere to 100,000 amperes for both metering and protection purposes. Currents below the rated current of the circuit breaker are important to users from a metering perspective, and it is desired to report to the end-user the level of these currents to a high degree of precision. Currents above the rated current of the circuit breaker must still be monitored, although not with the same precision as metered currents that are below the rated current of the circuit breaker.

Traditionally, current transformers have been used to provide the current sensing function in circuit breakers. However, the magnetic material present in current transformers can limit the range of operation because of magnetic saturation effects. By eliminating the magnetic material (e.g., by replacing it with a substantially lower permeability material, or by introducing a significant air gap), a sensor may be created that operates linearly over a much wider range. Such sensors tend to have a low impedance voltage output that is proportional to the rate of change of the primary current. Because of this response, these devices are often called di/dt sensors, or in special cases Rogowski coils after their inventor.

To compute the primary current from a di/dt sensor, its output must be integrated. The nature of the integration process is that the result depends on the input (in this case the di/dt sensor output) for all previous time. This fact presents a problem in trip units. In particular, all trip units must be powered by current. Thus, power to an electronic device that is able to perform this integration to get the primary current measurement is not initially available at startup. This results in errors that can shift protection functions in circuit breakers outside of their specified range.

One solution to this problem is to perform integration passively with just a resistor and capacitor. No power is required in this scheme and the proper choice of the resistor and capacitor will produce a voltage signal on the capacitor that is proportional to the primary current. However, this scheme has a number of drawbacks. For example, to meet the required precision over the wide range of currents for both protection and metering, the resistor and capacitor must have low drift with respect to temperature and time. This can result in requiring large, expensive resistors or capacitors. Also, the signal on the capacitor is reduced significantly in amplitude below that of the di/dt sensor's output, which results in the need for complicated processing of low current signals.

SUMMARY

These needs and others are met by embodiments of the disclosed concept, which, in one embodiment, are directed to a circuit interrupter that includes a passive integration channel and an active integration channel. The passive integration channel includes a passive integration circuit, and is structured to receive an output signal from a di/dt current sensor and generate a first signal output based on the output signal that is proportional to a primary current received by the di/dt current sensor. The active integration channel includes an active integrator, and is structured to receive the output signal from the di/dt current sensor and generate a second signal output based on the sensor output signal that is proportional to the primary current received by the di/dt current sensor. The circuit interrupter also includes a control system, wherein the control system stores and is structured to execute a number of routines, the number of routines being structured to provide circuit protection functionality for the circuit interrupter based on the first signal output responsive to the primary current being determined to be greater than a threshold level, provide current metering and circuit protection functionality for the circuit interrupter based on the second signal output responsive to the primary current being determined to be less than or equal to the threshold level, and provide a seed current value to the active integrator based on the first signal output.

In another embodiment, a method of operating a circuit interrupter is provided that includes receiving an output signal from a di/dt current sensor and generating a first signal output based on the output signal that is proportional to a primary current received by the di/dt current sensor using a passive integration channel including a passive integration circuit, receiving the output signal from the di/dt current sensor and generating a second signal output based on the output signal that is proportional to the primary current received by the di/dt current sensor using an active integration channel including an active integrator, providing circuit protection functionality for the circuit interrupter based on the first signal output responsive to the primary current being determined to be greater than a threshold level, providing current metering and circuit protection functionality for the circuit interrupter based on the second signal output responsive to the primary current being determined to be less than or equal to the threshold level, and providing a seed current value to the active integrator based on the first signal output.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
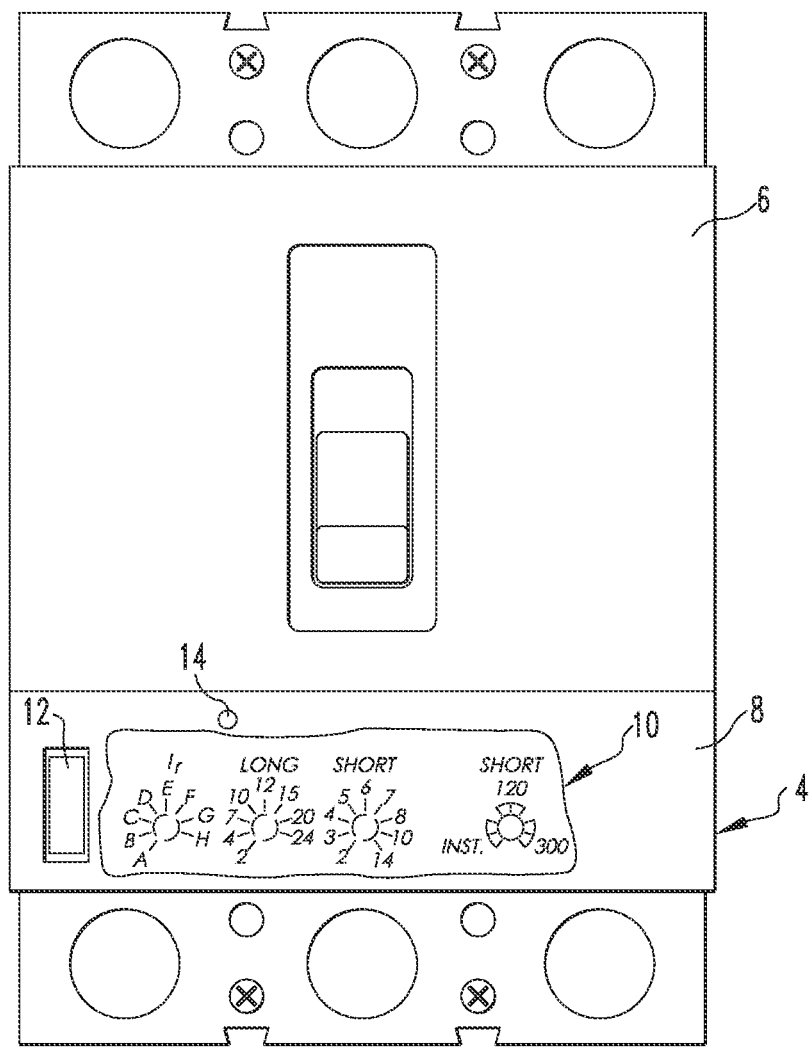
FIG. 1 is a schematic diagram of a circuit interrupter according to a non-limiting, exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "di/dt sensor" shall mean a sensor that provides an output signal (e.g., a voltage signal) that is proportional to the rate of change of an input signal (e.g., a primary current).

As employed herein, the term "passive integration circuit" shall mean an electrical circuit that is able to perform a continuous (analog) integration of a signal and that does not require a minimum level of power to operate to do so.

As employed herein, the term "active integrator" shall mean any electrical circuit and/or firmware algorithm that is able to perform an integration of a signal (to produce an output approximately proportional to the integral of the input) and that requires external power to do so, and may include, for example and without limitation, digital (microprocessor-based) integration or an analog (op amp based) active integrator circuit.

FIG. 1 is a schematic diagram of a configurable circuit interrupter 4 according to a non-limiting, exemplary embodiment of the disclosed concept. In the illustrated embodiment, circuit interrupter 4 is a molded case circuit breaker. It will be understood, however, that circuit interrupter 4 may take on forms other than a molded circuit breaker within the scope of the disclosed concept. Circuit interrupter 4 includes an operating mechanism 6 configured to rapidly open and close a set of separable contacts 7 (FIG. 2) provided as part of circuit interrupter 4. Circuit interrupter 4 also includes an electronic trip unit 8 operatively coupled to operating mechanism 6 which, in an automatic mode of operation, is structured to sense overcurrent conditions and in response thereto move operating mechanism 6 to a state wherein separable contacts 7 of circuit interrupter 4 are opened. As seen in FIG. 1, in the illustrated embodiment, electronic trip unit 8 includes a number of adjustable switches 10 for varying the functional trip settings (such as, for example and without limitation, long delay pickup (Ir), long delay time (LDT), short delay pickup (SDPU), ground fault pickup (GFPU), and short delay time and ground fault time (SDT/GFT)) of electronic trip unit 8. Electronic trip unit 8 also includes a serial port 12 and a trip unit status indicator 14 (in the form of an LED). In an alternative embodiment, switches 10 may be replaced by electronic settings.

Figure 2:
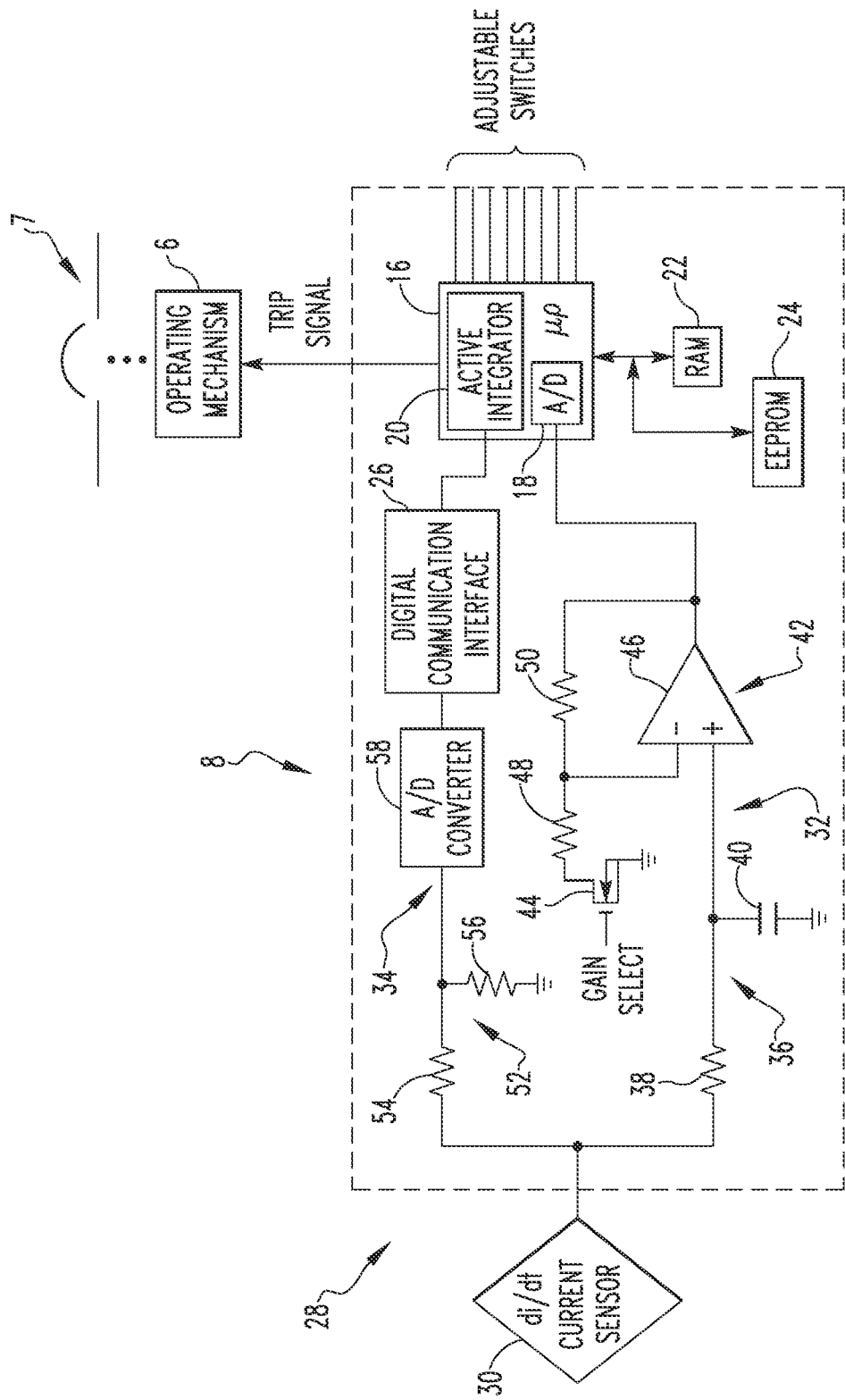
FIG. 2 is a schematic diagram showing certain selected components of the circuit interrupter of FIG. 1 according to the exemplary embodiment.

FIG. 2 is a schematic diagram showing certain selected components of circuit interrupter 4 and electronic trip unit 8 according to the exemplary embodiment. As seen in FIG. 2, electronic trip unit 8 includes a microprocessor (μP) 16 which controls the operation of electronic trip unit 8. Alternatively, microprocessor 16 may be another type of processing or control unit, such as, without limitation, a microcontroller or some other suitable processing device. As seen in FIG. 2, microprocessor 16 includes an internal analog-to-digital converter module 18, which in the exemplary embodiment is a 12-bit converter, and an active integrator module 20 (which in the non-limiting exemplary embodiment is a microprocessor-based digital integrator module), the functions of which are described elsewhere herein. Electronic trip unit 8 further includes a random access memory (RAM) 22 and an EEPROM 24, each of which is coupled to microprocessor 16. A number of software routines that are executable by microprocessor 16 are stored by electronic trip unit 8 (for example in separate flash memory inside or outside of microprocessor 16), including routines which implement a trip program for determining when to issue a trip signal for tripping operating mechanism 6, and routines for implementing a metering program for providing metering functionality for circuit interrupter 4. In this manner, microprocessor 16 and RAM 22 form at least part of a control system for circuit interrupter 4. In the exemplary embodiment, EEPROM 24 stores (in nonvolatile memory) the functional trip settings (such as, for example and without limitation, long delay pickup (Ir), long delay time (LDT), short delay pickup (SDPU), ground fault pickup (GFPU), and short delay time and ground fault time (SDT/GFT)) of electronic trip unit 8, which are read into microprocessor 16 as needed by the trip unit program. Electronic trip unit 8 also includes a digital communication interface from analog-to-digital converter 58 (described herein) to microprocessor 16 to allow for communication with microprocessor 16 as described herein.

Furthermore, as seen in FIG. 2, circuit interrupter 4 and electronic trip unit 8 further include a current sensing portion 28 for sensing current for both metering and circuit protection purposes according an aspect of the disclosed concept that allows di/dt current sensor 30 to effectively be employed for sensing currents over a wide operating range. In the exemplary embodiment, di/dt current sensor 30 is part of circuit interrupter 4, although it may also be a separate component coupled to circuit interrupter 4 within the scope of the disclosed concept. In particular, current sensing portion 28 utilizes two separate integration channels that directly receive the output of di/dt current sensor 30 and provide current measurements based thereon that are directly proportional to the primary current. Those two channels include a passive integration channel 32 for measuring "higher" currents above a certain threshold (as described herein), and an active integration channel 34 for measuring "lower" currents below the threshold. As described in greater detail below, the measurements of passive integration channel 32 are used in microprocessor 16 for two purposes. Specifically, the measurements of passive integration channel 32 are used: (i) by the trip program of microprocessor 16 for circuit protection purposes in the case of "higher" currents, and (ii) to provide a seed current value that is needed for active integration channel 34 (as described elsewhere herein, active integration requires knowledge of the current "for all times", i.e., beginning at startup of the integrator; the seed current value provides that information). The measurements of active integration channel 34 are also used in microprocessor 16 for two purposes. Specifically, the measurements of active integration channel 34 are used: (i) by the trip program of microprocessor 16 for circuit protection purposes in the case of "lower" currents, and (ii) by the metering routines of microprocessor 16 for current metering purposes. Active integration channel 34 is able to make more precise measurements because it does not rely on passive components. Active integration channel 34 has a current limit beyond which its A/D channel will saturate. This limit is chosen to be above the maximum metering range of circuit interrupter 4. Once saturated, active integration channel 34 must be re-seeded before being used again for metering or protection functions. Thus, the two channel system of the disclosed concept provides a solution to this problem by providing passive integration channel 32 which does not saturate and which is able to provide an accurate seed value at startup and after active channel recovery from saturation.

Referring again to FIG. 2, in the exemplary embodiment, passive integration channel 32 includes a passive integration circuit 36 that includes a resistor 38 and a capacitor 40, wherein the voltage signal on the capacitor is proportional to the primary current received by di/dt current sensor 30. Passive integration circuit 36 also includes a variable gain circuit 42 to assure that passive integration channel 32 can cover the range of currents for its full time, high current protection functions as well as its initial seeding functions. In the non-limiting, exemplary embodiment, variable gain circuit 42 includes a FET 44 coupled to an op amp 46 employing resistors 48 and 50. The analog output of variable gain circuit 42 (which is proportional to the primary current) is provided to analog-to-digital converter module 18, which converts that signal to digital data that is appropriate for microprocessor 16. As will be appreciated, that data may be stored in RAM 22 and/or used by the trip unit program implemented in microprocessor 16 as described herein in determining whether and when to issue a trip signal for tripping operating mechanism 6. That data may also be used to generate a seed current value for active integrator 20 as needed.

In the exemplary embodiment, active integration channel 34 includes a voltage divider circuit 52 having resistors 54 and 56 for scaling the output of di/dt current sensor 30 to a desired level. Active integration channel 34 also includes an analog-to-digital converter 58 which receives the scaled output and converts that signal to digital data. In the exemplary embodiment, analog-to-digital converter 58 is a 24-bit sigma-delta converter, although it will be appreciated that other converter types may also be employed within the scope of the disclosed concept. In addition, in the exemplary embodiment, analog-to-digital converter 58 is a device/chip that is separate from microprocessor 16. It will be appreciated, however, that analog-to-digital converter 58 may alternatively be implemented as an internal module of microprocessor 16. The digital data generated by analog-to-digital converter 58 is provided to active integrator 20 of microprocessor 16 through SPI 26. Naive integrator 20 is structured to generate data indicative of the primary current received by di/dt current sensor 30 based on the received data. As will be appreciated, that data may be stored in RAM 22 and/or used by the trip unit program implemented in microprocessor 16 as described herein in determining whether and when to issue a trip signal for tripping operating mechanism 6 and for generating current metering data.

Figure 3:
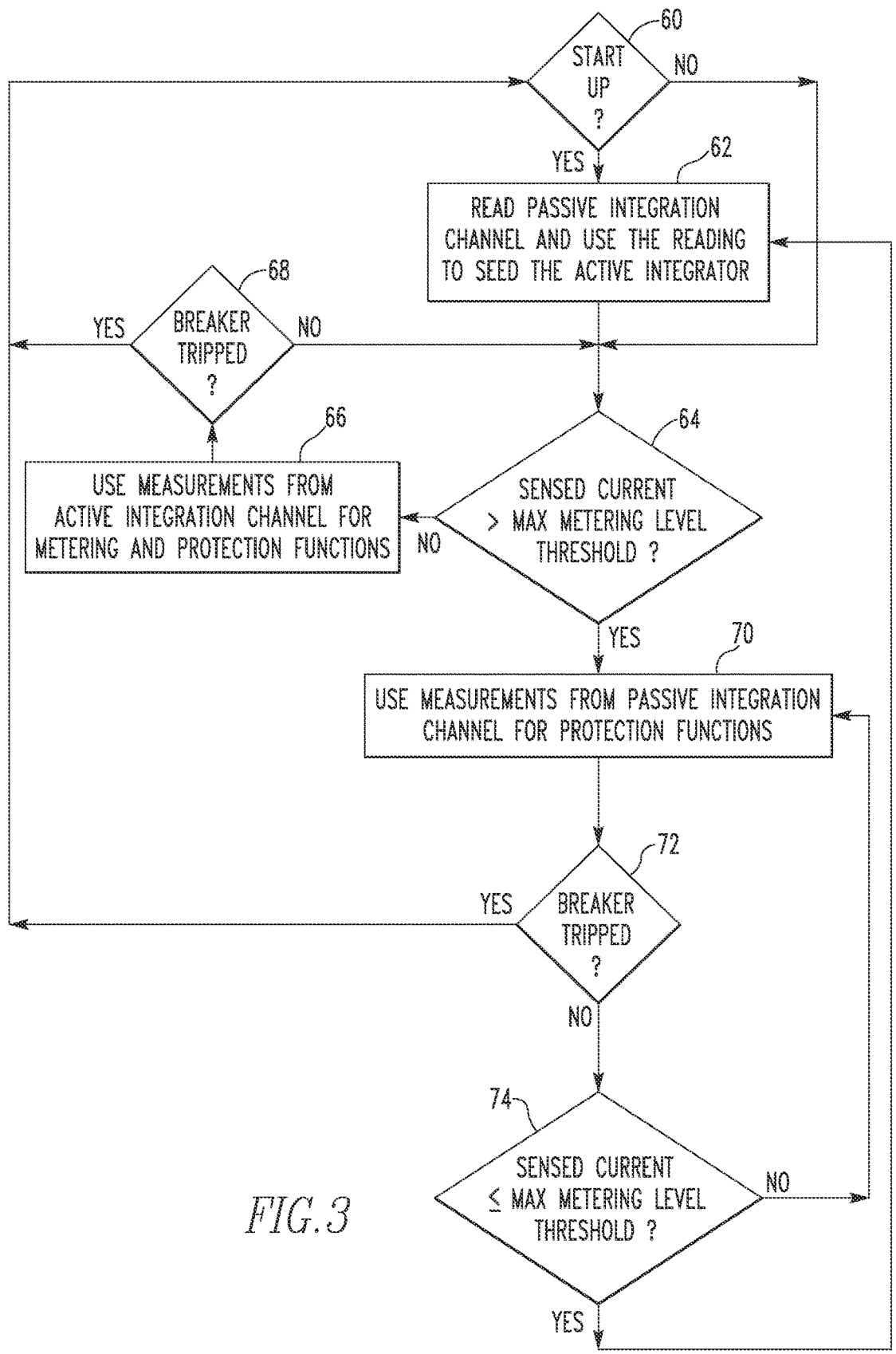
FIG. 3 is a flowchart showing a method of operating the circuit interrupter of FIG. 1 according to one exemplary, non-limiting embodiment.

FIG. 3 is a flowchart showing a method of operating circuit interrupter 4 according to one exemplary, non-limiting embodiment of the disclosed concept. As will be appreciated, the method may be implemented by one or more routines stored within the internal memory of microprocessor 16 and executable by microprocessor 16. The method begins at step 60, wherein a determination is made as to whether microprocessor 16 (and active integrator 20) has just been started up (meaning it has either just begun receiving power or has come out of a reset state). If the answer is no, then the method proceeds to step 64 described below. If, however, the answer is yes, then the method proceeds to step 62. At step 62, passive integration channel 32 is read to obtain a current measurement therefrom, and that current measurement is used to seed active integrator 20. Following either a no answer at step 60 (no startup) or the completion of step 62 (startup followed by seeding of active integrator 20), the method proceeds to step 64. At step 64, a determination is made as to whether the primary current (based on measurements made using passive integration channel 32 in the exemplary embodiment) is greater than a predetermined maximum metering level threshold. In the preferred embodiment, the predetermined maximum metering level threshold is chosen to be the same as the maximum rated current of circuit interrupter 4. In another embodiment, the predetermined maximum metering level threshold is a selectable value that is a multiple of the rated current of circuit interrupter 4. Multipliers typically range between 0.4 and 2 times the rating of the circuit breaker. If the answer is no, then the method proceeds to step 66. At step 66, the current measurement data as generated by active integration channel 34 as described herein is used for current metering and circuit protection purposes by microprocessor 16. The method then proceeds to step 68, wherein a determination as made as to whether circuit interrupter 4 has been tripped based on the measurement data. If the answer is no, then the method returns to step 64 for continued monitoring as described. If the answer at step 68 is yes, then the method returns to step 60 for monitoring of startup.

If, however, the answer at step 64 is yes, then the method proceeds to step 70. At step 70, the current measurement data as generated by passive integration channel 32 as described herein is used for circuit protection purposes by microprocessor 16. The method then proceeds to step 72, wherein a determination as made as to whether circuit interrupter 4 has been tripped based on the measurement data. if the answer at step 72 is yes, then the method returns to step 60 for monitoring of startup. If, however, the answer at step 72 is no, then the method proceeds to step 74, wherein a determination is made as to whether the primary current (based on measurements made using primary integration channel 32 in the exemplary embodiment) is less than or equal to the predetermined maximum metering level threshold. If the answer is no, then the method returns to step 70 for continued monitoring. If the answer at step 74 is yes, then the method returns to step 62 for re-seeding of active integrator 20.

Thus, the disclosed concept in the various embodiments described herein provides a dual channel system and method of operating a circuit interrupter that allows a di/dt current sensor to effectively be employed for sensing currents over a wide operating range.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter, comprising:
   a passive integration channel including a passive integration circuit, wherein the passive integration channel is structured to receive an output signal from a di/dt current sensor and generate a first signal output based on the output signal that is proportional to a primary current received by the di/dt current sensor;
   an active integration channel including an active integrator, wherein the active integration channel is structured to receive the output signal from the di/dt current sensor and generate a second signal output based on the output signal that is proportional to the primary current received by the di/dt current sensor;
   a control system, wherein the control system stores and is structured to execute a number of routines, the number of routines being structured to:
   provide circuit protection functionality for the circuit interrupter based on the first signal responsive to the primary current being determined to be greater than a threshold level;
   provide current metering and circuit protection functionality for the circuit interrupter based on the second signal output responsive to the primary current being determined to be less than or equal to the threshold level; and
   provide a seed current value to the active integrator based on the first signal output.

2. The circuit interrupter according to claim 1, wherein the routines are structured to provide the seed current value to the active integrator responsive to a startup or reset of the control system or responsive to a comparison of a magnitude of the primary current to the threshold level.

3. The circuit interrupter according to claim 1, wherein the di/dt current sensor is part of the circuit interrupter.

4. The circuit interrupter according to claim 1, wherein the active integration channel includes an analog-to-digital converter which is structured to receive the output signal from the di/dt current sensor and generate the second signal output.

5. The circuit interrupter according to claim 4, wherein the analog-to-digital converter is a sigma-delta converter.

6. The circuit interrupter according to claim 1, wherein the active integrator is provided as part of a processing device of the control system.

7. The circuit interrupter according to claim 1, wherein the passive integration channel includes includes a variable gain circuit coupled to the passive integration circuit.

8. The circuit interrupter according to claim 1, wherein the passive integration circuit comprises a resistor and a capacitor.

9. The circuit interrupter according to claim 1, wherein the passive integration channel includes an analog-to-digital converter which is structured receive an output from the passive integration circuit and generate the first signal output based on the output from the passive integration circuit.

10. The circuit interrupter according to claim 4, wherein the analog-to-digital converter is provided as part of a processing device of the control system.

11. The circuit interrupter according to claim 1, further comprising a set of separable contacts and an operating mechanism operatively coupled to the set of separable contacts, and wherein the passive integration channel, the active integration channel and the control system are provided as part of a trip unit structured to provide a trip signal to the operating mechanism.

12. A method of operating a circuit interrupter, comprising:
   receiving an output signal from a di/dt current sensor and generating a first signal output based on the output signal that is proportional to a primary current received by the di/dt current sensor using a passive integration channel including a passive integration circuit;
   receiving the output signal from the di/dt current sensor and generating a second signal output based on the output signal that is proportional to the primary current received by the di/dt current sensor using an active integration channel including an active integrator;
   providing circuit protection functionality for the circuit interrupter based on the first signal output responsive to the primary current being determined to be greater than a threshold level;
   providing current metering and circuit protection functionality for the circuit interrupter based on the second signal output responsive to the primary current being determined to be less than or equal to the threshold level; and
   providing a seed current value to the active integrator based on the first signal output.

13. The method according to claim 12, wherein the seed current value is provided to the active integrator responsive to a startup or reset of the control system or responsive to the primary current being determined to be greater than the threshold level and thereafter being determined to be less than or equal to the threshold level.

* * * * *